(12) United States Patent
Shin

(10) Patent No.: US 11,959,959 B2
(45) Date of Patent: Apr. 16, 2024

(54) BURN IN BOARD TEST DEVICE AND SYSTEM

(71) Applicant: SAMSUNG ELECTRONICS CO., LTD., Suwon-si (KR)

(72) Inventor: Seong Seob Shin, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 17/151,297

(22) Filed: Jan. 18, 2021

(65) Prior Publication Data

US 2021/0373070 A1 Dec. 2, 2021

(30) Foreign Application Priority Data

May 28, 2020 (KR) ........................ 10-2020-0064354

(51) Int. Cl.
*G01R 31/28* (2006.01)

(52) U.S. Cl.
CPC ................................ *G01R 31/2817* (2013.01)

(58) Field of Classification Search
CPC .......... G01R 31/2817; G01R 31/31903; G01R 31/2868; G01R 31/31908; G01R 31/31917; G01R 31/3193
USPC .......................................... 324/750.05–750.7
See application file for complete search history.

(56) References Cited

U.S. PATENT DOCUMENTS

| 7,541,825 | B2 * | 6/2009 | Attalla | G01R 31/31721 |
| | | | | 324/750.05 |
| 7,890,822 | B2 * | 2/2011 | Behziz | G01R 31/31922 |
| | | | | 714/724 |
| 9,378,846 | B2 | 6/2016 | Han | |
| 10,459,348 | B2 | 10/2019 | Jung et al. | |
| 2004/0199838 | A1 * | 10/2004 | Rutkowski | G01R 31/318572 |
| | | | | 714/724 |
| 2004/0257106 | A1 * | 12/2004 | Kang | G01R 31/318505 |
| | | | | 324/750.3 |
| 2006/0290366 | A1 * | 12/2006 | Kon | G01R 31/2874 |
| | | | | 324/750.06 |
| 2017/0256324 | A1 | 9/2017 | Kagami et al. | |

FOREIGN PATENT DOCUMENTS

| KR | 10-2004-0104970 | 12/2004 |
| KR | 10-2008-0061735 | 7/2008 |
| KR | 10-2010-0131705 | 12/2010 |
| KR | 10-1466665 | 12/2014 |
| KR | 10-1561854 | 10/2015 |
| KR | 10-1950423 | 2/2019 |

* cited by examiner

*Primary Examiner* — Steven L Yeninas
*Assistant Examiner* — Rahul Maini
(74) *Attorney, Agent, or Firm* — F. Chau & Associates, LLC

(57) ABSTRACT

A burn in board test device including: a plurality of devices under test, wherein each of the devices under test includes a burn in device; a plurality of resistors connected to each of the plurality of devices under test; a plurality of device under test switches connected to each of the plurality of resistors; and a device under test tester which is connected a plurality of sub input/output (I/O) channels connected to each of the plurality of device under test switches, and a main I/O channel for connecting the plurality of sub I/O channels to each other to test the plurality of devices under test.

20 Claims, 11 Drawing Sheets

BURN IN BOARD TEST DEVICE AND SYSTEM

CROSS-REFERENCE TO RELATED APPLICATION

This application claims priority under 35 U.S.C. 119 to Korean Patent Application No. 10-2020-0064354, filed on May 28, 2020, the disclosure of which is incorporated by reference herein in its entirety.

1. TECHNICAL FIELD

The present inventive concept relates to a burn in board test device and system.

2. DESCRIPTION OF THE RELATED ART

As the size of electronic circuit patterns of semiconductor devices and/or electronic devices decreases, the number of devices formed on a wafer increases, especially when there is an increase in size of the wafer. A plurality of channels are typically employed to test the devices on the wafer.

However, there is a limit to the number of channels that may be directly connected to a tester for testing the devices on the wafer. As a consequence, to test a large number of devices, the channels directly connected to the tester may be branched and connected to the devices.

Currently, at the time of a test operation on a plurality of devices (e.g., a Device Under Test (DUT)) connected to the branched channels, since the test operations performed on different devices may influence each other, independent test operations and accurate results of each of the plurality of devices may not be ensured.

SUMMARY

According to an exemplary embodiment of the present inventive concept, there is provided a burn in board test device including: a plurality of devices under test, wherein each of the devices under test includes a burn in device; a plurality of resistors connected to each of the plurality of devices under test; a plurality of device under test switches connected to each of the plurality of resistors; and a device under test tester which is connected a plurality of sub input/output (I/O) channels connected to each of the plurality of device under test switches, and a main I/O channel for connecting the plurality of sub I/O channels to each other to test the plurality of devices under test.

According to an exemplary embodiment of the present inventive concept, there is provided a burn in board test device including: a Device Under Test (DUT) tester connected to a DUT through a first channel to test the DUT; a DUT switch connected between the DUT and the DUT tester; and a resistor connected between the DUT and the DUT tester, wherein the DUT switch shorts the first channel when the DUT tester tests the DUT.

According to an exemplary embodiment of the present inventive concept, there is provided a burn in board test system including: a clock generator which generates a clock; a plurality of clock switches which transmits the clock; and a burn in board test device which operates by the clock, wherein the burn in board test device includes a plurality of devices under test arranged in a first direction, and a second direction intersecting the first direction, a plurality of device under test testers which tests the plurality of devices under test arranged side by side in the first direction, among the plurality of devices under test, a plurality of resistors and a plurality of device under test switches disposed between the plurality of device under test testers and the plurality of devices under test.

BRIEF DESCRIPTION OF THE DRAWINGS

The above and other features of the present inventive concept will become more apparent by describing in detail exemplary embodiments thereof with reference to the attached drawings, in which:

FIG. 7 is a diagram of a plurality of burn in boards in which a test result is normal.

FIG. 8 is a diagram of a plurality of burn in boards in which the test results are abnormal.

FIG. 10 is another diagram of a plurality of burn in boards in which the test result is abnormal.

In the drawings, like reference numerals may refer to like elements.

DETAILED DESCRIPTION OF THE EMBODIMENTS

Figure 1:
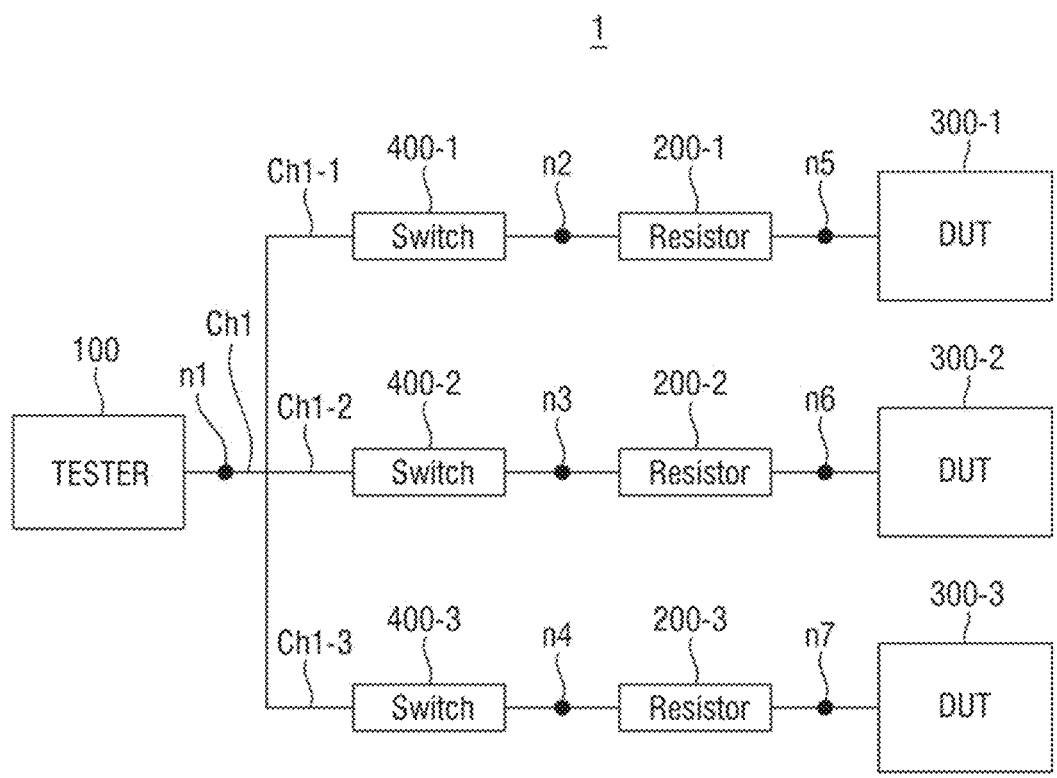
FIG. 1 is a diagram showing a burn in board test device according to exemplary embodiments of the present inventive concept.

FIG. 1 is a diagram showing a burn in board test device according to exemplary embodiments of the present inventive concept.

Referring to FIG. 1, a burn in board test device 1 according to exemplary embodiments of the present inventive concept includes a plurality of Devices Under Test (DUTs) 300-1, 300-2, and 300-3, a plurality of resistors 200-1, 200-2, and 200-3, a plurality of DUT switches 400-1, 400-2, and 400-3, and a Device Under Test (DUT) tester 100. Herein, DUTs may refer to devices under test and DUT may refer to a device under test.

The plurality of DUTs 300-1, 300-2, and 300-3 includes a plurality of burn in devices disposed on the respective boards. In other words, a voltage close to a threshold value under a high temperature condition is applied to the semiconductor devices on the board in the plurality of DUTs 300-1, 300-2, and 300-3 for a certain time or longer. The semiconductor devices stressed under the aforementioned conditions may become a burn in device. In other words, it is possible to detect presence or absence of defects that may occur in the devices in a state in which a high stress is applied, through a plurality of burn in devices on the board included in each of a plurality of DUTs 300-1, 300-2, and 300-3.

The board may be, for example, a printed circuit board, a ceramic board or an interposer. When the board is a printed circuit board, the board may include a substrate base, and an upper surface pad and a lower surface pad formed on each of the upper and lower surfaces of the substrate base. The tester 100 and the plurality of DUTs 300-1, 300-2, and 300-3 may be electrically connected to each other through the upper surface pad and/or the lower surface pad.

The substrate base may include phenol resin, epoxy resin, or polyimide. For example, the substrate base may include FR4, Tetrafunctional epoxy, Polyphenylene ether, Epoxy/polyphenylene oxide, Bismaleimide triazine (BT), Thennount, cyanate ester, polyimide, or liquid crystal polymers. The upper surface pad and the lower surface pad may be made of copper, nickel, stainless steel or beryllium copper. An internal wiring that electrically connects the upper surface pad and the lower surface pad may be formed in the substrate base. The upper surface pad and the lower surface pad may be portions of the circuit wiring patterned after coating the upper and lower surfaces of the substrate base with copper foil and exposed by a solder resist layer.

When the board is an interposer, the board may include a substrate base made of a semiconductor material, and an upper surface pad and a lower surface pad formed on each of the upper and lower surfaces of the substrate base. The substrate base may be formed of, for example, a silicon wafer. Wirings may be formed on the upper surface, the lower surface or the inside of the substrate base. In addition, a penetration via which electrically connects the upper surface pad, the lower surface pad and the wirings may be formed inside the substrate base.

Each of the plurality of DUTs 300-1, 300-2, and 300-3 may have various forms depending on the forms and types of a plurality of burn in devices. For example, each of the plurality of DUTs 300-1, 300-2, and 300-3 may be sockets having a form coupling with ball grid arrays (BGAs), a Plastic Leaded Chip Carrier (PLCC), a Plastic Dual In-Line Package (PDIP), a Ceramic Dual In-Line Package (CERDIP), a Plastic Metric Quad Flat Pack (MQFP), a Thin Quad Flatpack (TQFP), Small outline integrated circuit (SOIC), a Shrink Small Outline Package (SSOP), a Thin Small Outline (TSOP) or a Thin Quad Flatpack (TQFP), or a universal socket that may couple with various connectors. Alternatively, each of the plurality of DUTs 300-1, 300-2, and 300-3 may have a connector capable of coping with various types of sockets.

The tester 100 is provided to test each of the plurality of DUTs 300-1, 300-2, and 300-3. The tester 100 may be configured by a single semiconductor chip such as a Field Programmable Gate Array (FPGA), an Application Specific Integrated Circuit (ASIC), and an Application Processor (AP). In exemplary embodiments of the present inventive concept, the tester 100 may be configured, for example, using an FPGA of Xilinx, Altera Lattice Semiconductor, Microsemi, Achronix, QuickLogic, e2v or Atmel.

The tester 100 may be electrically connected to the plurality of DUTs 300-1, 300-2, and 300-3 through a plurality of sub input/output (I/O) channels Ch1-1, Ch1-2, and Ch1-3 that branch from a first main I/O channel Ch1.

There is a limit to the number of I/O channels assigned to the tester 100. Therefore, performing a test with only the I/O channels assigned to the tester 100 may result in less than all of the semiconductor devices being tested due to a decrease in wafer size. To test a large number of semiconductor devices with the I/O channels assigned to the tester 100, the I/O channels assigned to the tester 100 may be branched and connected to a plurality of semiconductor devices.

For example, the I/O channel assigned to the tester 100 may be assumed to be a first channel Ch1. However, as the number of semiconductor devices to be tested increases, the number of DUTs also increases. Therefore, to test the first DUT 300-1, the second DUT 300-2, and the third DUT 300-3 through the tester 100, the main I/O channel Ch1 may be branched into a first sub I/O channel Ch1-1, a second sub I/O channel Ch1-2, and a third sub I/O channel Ch1-3. In other words, the first sub I/O channel Ch1-1, the second sub I/O channel Ch1-2, and the third sub I/O channel Ch1-3 may be connected to a first node n1.

For example, the first sub I/O channel Ch1-1 branching from the first main I/O channel Ch1 electrically connects the tester 100 and the first DUT 300-1. The second sub I/O channel Ch1-2 branching from the first main/O channel Ch1 electrically connects the tester 100 and the second DUT 300-2. The third sub I/O channel Ch1-3 branching from the first main I/O channel Ch1 electrically connects the tester 100 and the third DUT 300-3.

The number of plurality of DUTs 300-1, 300-2, and 300-3 connected to the tester 100 and the connection form thereof are not limited thereto.

Resistors (e.g., a first resistor 200-1, a second resistor 200-2, and a third resistor 200-3) may be connected to each of the sub I/O channels (e.g., the first sub I/O channel Ch1-1, the second sub I/O channel Ch1-2, and the third sub I/O channel Ch1-3).

For example, the first resistor 200-1 may be connected to the first sub I/O channel Ch1-1. In other words, the first resistor 200-1 and the first DUT 300-1 may be connected to each other through a fifth node n5. Further, the second resistor 200-2 may be connected to the second sub I/O channel Ch1-2. In other words, the second resistor 200-2 and the second DUT 300-2 may be connected to each other through a sixth node n6. The third resistor 200-3 may be connected to the third sub I/O channel Ch1-3. In other words, the third resistor 200-3 and the third DUT 300-3 may be connected to each other through a seventh node n7.

The first resistor 200-1, the second resistor 200-2, and/or the third resistor 200-3 may have a resistance value equal to or greater than 10 ohms and less than 1,000 ohms. For example, the first resistor 200-1, the second resistor 200-2, and/or the third resistor 200-3 may have a high resistance value. For example, the first resistor 200-1, the second resistor 200-2, and/or the third resistor 200-3 may have a resistance value of 500 ohms. Since each of the first resistor 200-1, the second resistor 200-2, and/or the third resistor 200-3 has a high resistance value, the interference between the plurality of DUTs 300-1, 300-2, and 300-3 can be reduced. Timing when the tester 100 performs a writing operation for a test on a plurality of DUTs 300-1, 300-2, and 300-3 will be explained, for example, with reference to FIG. 2.

Figure 2:
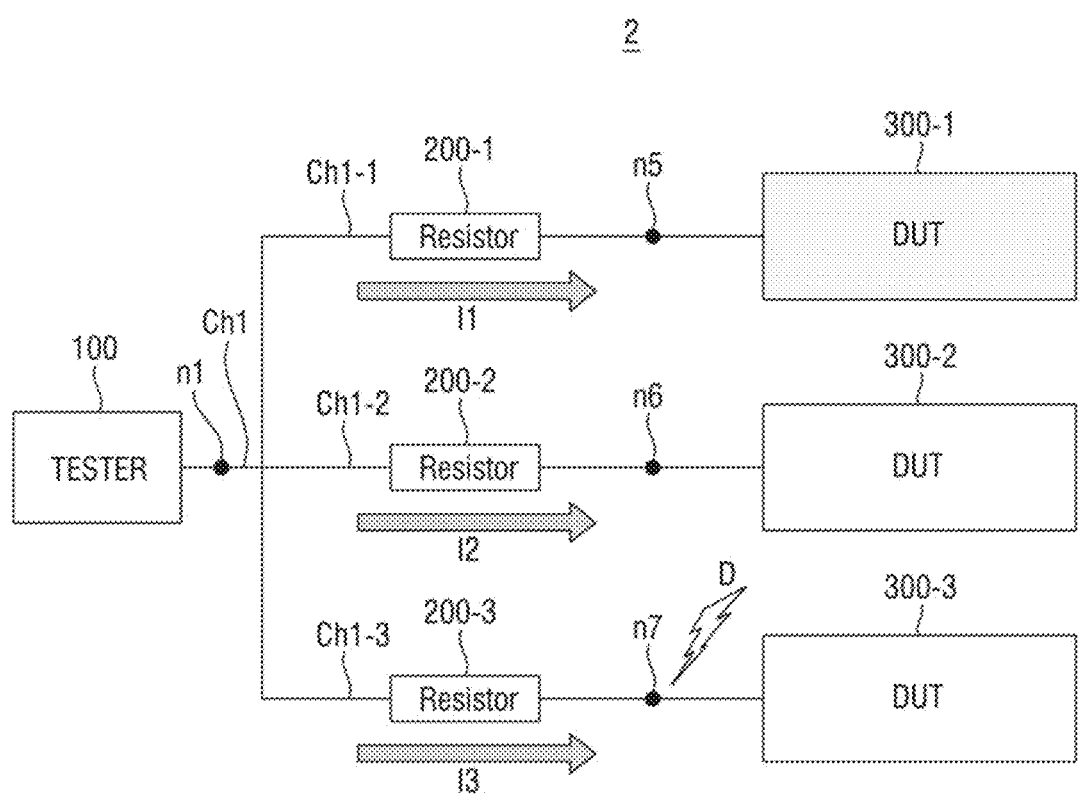
FIG. 2 is a diagram showing a writing operation of the burn in board test device in which a leakage occurs.

FIG. 2 is a diagram showing a writing operation of a burn in board test device 2 in which a leakage occurs.

Referring to FIG. 2, when the tester 100 performs the writing operation for test on the plurality of DUTs 300-1, 300-2, and 300-3, a write current may be supplied to the respective DUTs 300-1, 300-2, and 300-3. For example, when trying to perform the writing operation for test on the first DUT 300-1, a first current I11 may be transmitted from the tester 100 to the first DUT 300-1 through the first main I/O channel Ch1 and the first sub I/O channel Ch1-1. When trying to perform the writing operation for test on the second DUT 300-2, a second current I2 may be transmitted from the tester 100 to the second DUT 300-2 through the first main I/O channel Ch1 and the second sub I/O channel Ch1-2.

When trying to perform the writing operation for test on the third DUT 300-3, a third current I3 may be transmitted from the tester 100 to the third DUT 300-3 through the first main I/O channel Ch1 and the third sub I/O channel Ch1-3.

In this case, since the first resistor 200-1, the second resistor 200-2, and/or the third resistor 200-3 have a high resistance value, when the tester 100 performs the writing operation for test on the plurality of DUTs 300-1, 300-2, and 300-3, the interference between the plurality of DUTs 300-1, 300-2, and 300-3 can be reduced.

For example, a case where the first current I1 is transmitted to the first DUT 300-1 to perform the writing operation for test will be assumed. In this case, for example, it is assumed that a defect D has occurred in the seventh node n7 of the third sub I/O channel Ch1-3. The defect D may be for example, a case where the seventh node n7 is shorted.

At this time, a test failure may occur in the third DUT 300-3 connected to the defective third sub I/O channel Ch-3. In other words, the third current I3 transmitted from the tester 100 to the third DUT 300-3 may not be written on the third DUT 300-3. However, since the first resistor 200-1, the second resistor 200-2, and/or the third resistor 200-3 have a high resistance value, the writing operation for test may not be affected by transmitting the first current I1 to the first DUT 300-1.

In other words, since the first resistor 200-1, the second resistor 200-2, and/or the third resistor 200-3 have a high resistance value, when the tester 100 performs the writing operation for test on the plurality of DUTs 300-1, 300-2, and 300-3, independence between the plurality of DUTs 300-1, 300-2, and 300-3 can be ensured.

For reference, in FIG. 2, although a case where a defect occurs in the third sub I/O channel Ch1-3 connected to the third DUT 300-3 has been explained as an example of performing the writing operation for test on the first DUT 300-1, the disclosure is not limited thereto. In other words, when performing the writing operation for test on the first DUT 300-1, the independence can be ensured also in a case where a defect occurs on the second sub I/O channel Ch1-2 connected to the second DUT 300-2. In addition, when performing the writing operation for test on the second DUT 300-2, the independence can be ensured also in a case where a defect occurs in the first sub I/O channel Ch1-1 connected to the first DUT 300-1. In addition, when performing the writing operation for test on the second DUT 300-2, the independence can be ensured also in a case where a defect occurs in the third sub VO channel Ch1-3 connected to the third DUT 300-3. In addition, when performing the writing operation for test on the third DUT 300-3, the independence can be ensured also in a case where a defect occurs in the first sub I/O channel Ch1-1 connected to the first DUT 300-1. In addition, when performing the writing operation for test on the third DUT 300-3, the independence can be ensured also in a case where a defect occurs in the second sub I/O channel Ch1-2 connected to the second DUT 300-2.

However, in a case where only the first resistor 200-1, the second resistor 200-2, and/or the third resistor 200-3 of high resistance are connected to each of the sub IVO channels Ch1-1, Ch1-2, and Ch1-3, when the tester 100 performs the reading operation for test on each of a plurality of DUTs 300-1, 300-2, and 300-3, independence between the plurality of DUTs 300-1, 300-2, and 300-3 may not be ensured. This will be explained with reference to FIG. 3.

Figure 3:
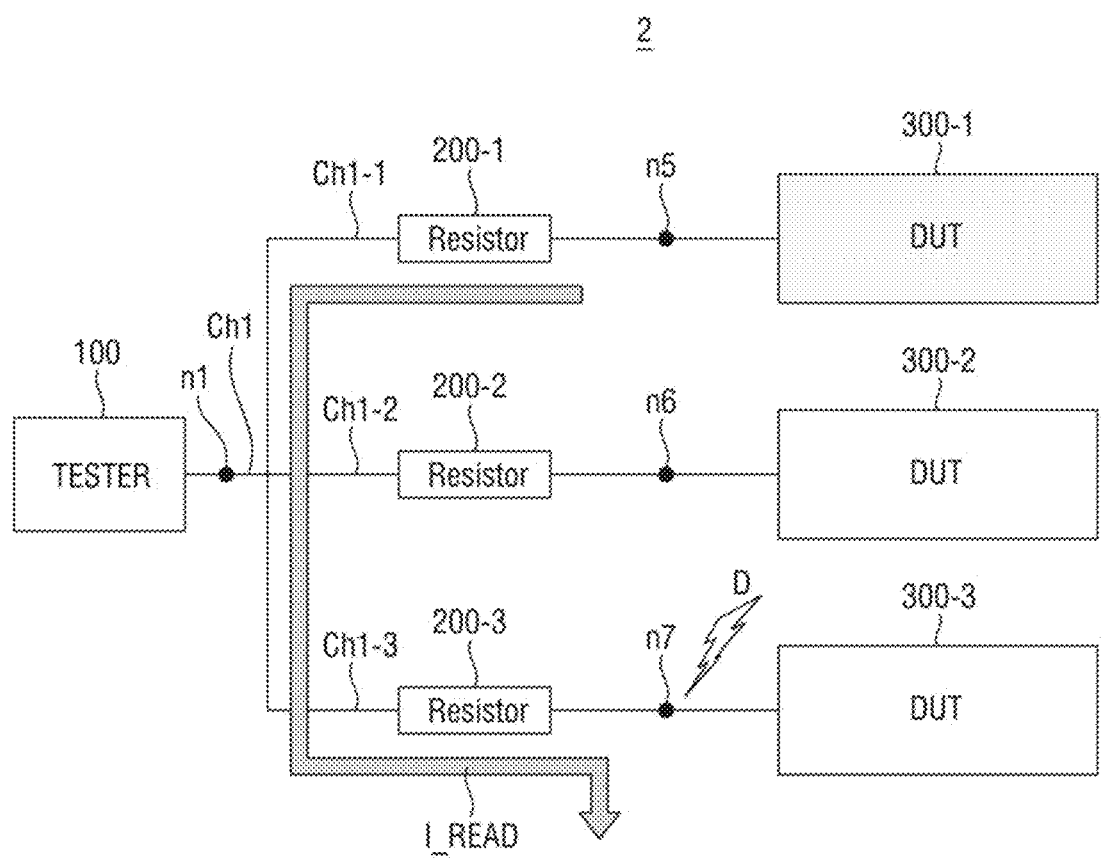
FIG. 3 is a diagram showing a reading operation of the burn in board test device in which a leakage occurs.

FIG. 3 is a diagram showing a reading operation of the burn in board test device 2 in which a leakage occurs.

Referring to FIG. 3, when the tester 100 performs the reading operation for test on the plurality of DUTs 300-1, 300-2, and 300-3, data may be loaded to each of the DUTs 300-1, 300-2, and 300-3. For example, if the tester 100 tries to perform the reading operation for test on the first DUT 300-1, data may be read from the first DUT 300-1 through the first main I/O channel Ch1 and the first sub I/O channel Ch1-1. In addition, if the tester 100 tries to perform the reading operation for test on the second DUT 300-2, data may be read from the second DUT 300-2 through the first main I/O channel Ch1 and the second sub I/O channel Ch1-2. In addition, if the tester 100 tries to perform the reading operation for test on the third DUT 300-3, data may be read from the third DUT 300-3 through the first main I/O channel Ch1 and the third sub I/O channel Ch1-3.

For example, a case where the tester 100 reads data for test from the first DUT 300-1 will be assumed. In this case, for example, it is assumed that a defect D has occurred in the seventh node n7 of the third sub I/O channel Ch1-3. The defect D may be, for example, a case where the seventh node n7 is shorted.

At this time, in the process in which the tester 100 reads the data from the first DUT 300-1, the read data may pass through the first sub I/O channel Ch1-1 to the third sub I/O channel Ch1-3. In other words, although the data loaded from the first DUT 300-1 is to be transmitted to the tester 100 through the first main channel Ch1, the data may not be transmitted to the tester 100 due to a defect that occurs in the third sub I/O channel Ch1-3. Since a resistance value of the tester 100 has a resistance that is relatively higher than the resistance value of the third resistor 200-3, the data of the first DUT 300-1 is not transmitted to the tester 100 and may pass through the third resistor 200-3 to the third sub I/O channel Ch1-3. In other words, in the process in which the tester 100 reads data from the first DUT 300-1, the read data may flow along a leakage path 1_READ.

In other words, if only the first resistor 200-1, the second resistor 200-2 and/or the third resistor 200-3 of high resistance are connected to each of the sub I/O channels Ch1-1, Ch1-2, and Ch1-3, when the tester 100 performs the reading operation for test on each of the plurality of DUTs 300-1, 300-2, and 300-3, independence between the plurality of DUTs 300-1, 300-2, and 300-3 may not be ensured.

For reference, although FIG. 3 illustrates an example in which a defect occurs in the third sub I/O channel Ch1-3 connected to the third DUT 300-3 when performing the reading operation for the test on the first DUT 300-1, the disclosure is not limited thereto. In other words, when the reading operation for test is performed on the first DUT 300-1, in a case where a defect occurs in the second sub I/O channel Ch1-2 connected to the second DUT 300-2, the independence may not be ensured as well. In addition, when the reading operation for test is performed on the second DUT 300-2, in a case where a defect occurs in the first sub I/O channel Ch1-1 connected to the first DUT 300-1, the independence may not be ensured as well. In addition, when the reading operation for test is performed on the second DUT 300-2, in a case where a defect occurs in the third sub I/O channel Ch1-3 connected to the third DUT 300-3, the independence may not be ensured as well. In addition, when the reading operation for test is performed on the third DUT 300-3, in a case where a defect occurs in the first sub I/O channel Ch1-1 connected to the first DUT 300-1, the independence may not be ensured as well. In addition, when the reading operation for test is performed on the third DUT 300-3, in a case where a defect occurs in the second sub I/O channel Ch1-2 connected to the second DUT 300-2, the independence may not be ensured as well.

Therefore, when the tester 100 performs the reading operation for test on each of the plurality of DUTs 300-1, 300-2, and 300-3, the DUT switches 400-1, 400-2, and 400-3 may be connected to each of the plurality of sub I/O channels Ch1-1, Ch1-2, and Ch1-3 as shown in FIG. 1 to ensure independence between each of the plurality of DUTs 300-1, 300-2, and 300-3.

Referring again to FIG. 1, the burn in board test device 1 according to exemplary embodiments of the present inventive concept which ensures independence between the plurality of DUTs 300-1, 300-2, and 300-3 when the tester 100 performs the reading operation for test on each of the plurality of DUTs 300-1, 300-2, and 300-3 will be explained.

The DUT switches 400-1, 400-2, and 400-3 may be connected to each of the sub I/O channels (e.g., the first sub I/O channel Ch1-1, the second sub I/O channel Ch1-2, and the third sub I/O channels Ch1-3) of the burn in board test device 1 according to exemplary embodiments of the present inventive concept.

For example, a first DUT switch 400-1 may be connected to the first sub I/O channel Ch1-1. In other words, the first DUT switch 400-1 and the first resistor 200-1 may be connected to each other through the second node n2. In addition, a second DUT switch 400-2 may be connected to the second sub I/O channel Ch1-2. In other words, the second DUT switch 400-2 and the second resistor 200-2 may be connected to each other through the third node n3. In addition, a third DUT switch 400-3 may be connected to the third sub I/O channel Ch1-3. In other words, the third DUT switch 400-3 and the third resistor 200-3 may be connected to each other through the fourth node n4.

The first DUT switch 400-1, the second DUT switch 400-2, and/or the third DUT switch 400-3 according to exemplary embodiments of the present inventive concept may be transmission gates. Alternatively, the first DUT switch 400-1, the second DUT switch 400-2, and/or the third DUT switch 400-3 according to exemplary embodiments of the present inventive concept may be analog switches. Alternatively, the first DUT switch 400-1, the second DUT switch 400-2, and/or the third DUT switch 400-3 according to exemplary embodiments of the present inventive concept may be metal-oxide-semiconductor (MOS) transistors. The first DUT switch 400-1, the second DUT switch 400-2, and/or the third DUT switch 400-3 according to exemplary embodiments of the present inventive concept are not limited thereto. For example, any element capable of functioning as a switch that can short or open each of the sub I/O channels Ch1-1, Ch1-2, and Ch1-3 may be used.

In other words, the burn in board test device 1 according to exemplary embodiments of the present inventive concept may ensure independence between the plurality of DUTs 300-1, 300-2, and 300-3, when the tester 100 performs the reading operation for test on each of the plurality of DUTs 300-1, 300-2, and 300-3 through the DUT switches 400-1, 400-2, and 400-3.

For example, when the tester 100 performs the reading operation for test of the first DUT 300-1, the first switch 400-1 is closed and the remaining switches 400-2 and 400-3 may be opened. In other words, when the tester 100 performs the reading operation for test of the first DUT 300-1, since only the tester 100 and the first DUT 300-1 are electrically connected to each other, the test reading operation may be independently executed without being affected by a defect that occurs in other sub I/O channels Ch1-2 and Ch1-3.

Or, for example, when the tester 100 performs the reading operation for test of the second DUT 300-2, the second switch 400-2 is closed and the remaining switches 400-1 and 400-3 may be opened. In other words, when the tester 100 performs the reading operation for test of the second DUT 300-2, since only the tester 100 and the second DUT 300-2 are electrically connected to each other, the test reading operation may be independently executed, without being affected by a defect that occurs in other sub I/O channels Ch1-1 and Ch1-3.

In another example, when the tester 100 performs the reading operation for test of the third DUT 300-3, the third switch 400-3 is closed and the remaining switches 400-1 and 400-2 may be opened. In other words, when the tester 100 performs the reading operation for test of the third DUT 300-3, since only the tester 100 and the third DUT 300-3 are electrically connected to each other, the test reading operation may be independently executed, without being affected by a defect that occurs in other sub I/O channels Ch1-1 and Ch1-2.

The burn in board test device 1 according to exemplary embodiments of the present inventive concept including a plurality of testers will be described below as an example.

Figure 4:
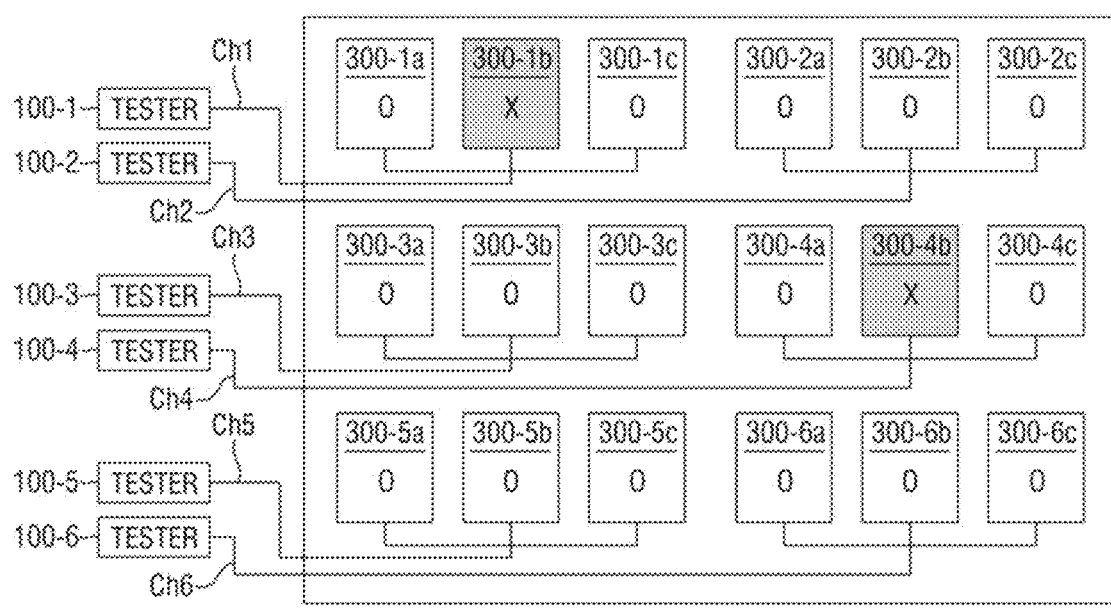
FIG. 4 is a diagram showing an operation result before the burn inboard test.

FIG. 4 is a diagram showing an operation result before the burn in board test.

Referring to FIG. 4, a plurality of testers 100-1, 100-2, 100-3, 100-4, 100-5 and 100-6 and a plurality of DUTs 300-1a, 300-1b and 300-1c, 300-2a, 300-2b and 300-2c, 300-3a, 300-3b and 300-3c, 300-4a, 300-4b and 300-4c, 300-5a, 300-5b and 300-5c, and 300-6a. 300-6b and 300-6c exchange data through a plurality of main I/O channels Ch1, Ch2, Ch3, Ch4, Ch5 and Ch6 connected to each of the plurality of testers 100-1 to 100-6.

For example, a plurality of DUTs 300-1a to 300-1c exchanges data with the first tester 100-1 through the channels branching from the first main channel Ch1 connected to the first tester 100-1. A plurality of DUTs 300-2a to 300-2c exchanges data with the second tester 100-2 through the channels branching from the second main channel Ch2 connected to the second tester 100-2. A plurality of DUTs 300-3a to 300-3c exchanges data with the third tester 100-3 through the channels branching from the third main channel Ch3 connected to the third tester 100-3. A plurality of DUTs 300-4a to 300-4c exchanges data with the fourth tester 100-4 through the channels branching from the fourth main channel Ch4 connected to the fourth tester 100-4. A plurality of DUTs 300-5a to 300-5c exchanges data with the fifth tester 100-5 through the channels branching from the fifth main channel Ch5 connected to the fifth tester 100-5. A plurality of DUTs 300-6a to 300-6c exchanges data with the sixth tester 100-6 through the channels branching from the sixth main channel Ch6 connected to the sixth tester 100-6.

For example, FIG. 4 does not show resistors, switches and the like connected between the plurality of DUTs 300-1a to 300-1c, 300-2a to 300-2c, 300-3a to 300-3c, 300-4a to 300-4c, 300-5a to 300-5c, and 300-6a to 300-6c and the plurality of testers 100-1 to 100-6 for simplification. The omitted elements will be shown and explained in the explanation of FIGS. 5 and 6 below.

Before testing each of the plurality of DUTs 300-1a to 300-1c, 300-2a to 300-2c, 300-3a to 300-3c, 300-4a to 300-4c, 300-5a to 300-5c, and 300-6a to 300-6c through the plurality of testers 100-1 to 100-6, some of the plurality of DUTs 300-1a to 300-1c, 300-2a to 300-2c, 300-3a to 300-3c, 300-4a to 300-4c, 300-5a to 300-5c, and 300-6a to 300-6c may be defective.

For example, among the plurality of DUTs 300-1a to 300-1c, 300-2a to 300-2c, 300-3a to 300-3c, 300-4a to 300-4c, 300-4c, 300-5a to 300-5c, and 300-6a to 300-6c, the DUT 300-1b to be tested through the first tester 100-1 and the DUT 300-4b to be tested through the fourth tester 100-4 may be defective. The defective DUTs, e.g., DUT 300-1b and DUT 300-4b, are indicated with a boxed X in FIG. 4.

Therefore, if the first tester 100-1 performs the burn-in test of the DUT 300-1b, only the DUT 300-1b needs to be identified by fail. If the fourth tester 100-4 performs the burn-in test of the DUT 300-4b, only the DUT 300-4b needs to be identified by fail.

In other words, the DUTs 300-1a to 300-1c connected to the channels branching from the first channel Ch1 of the first tester 100-1 are to have test results independent of each other. In addition, the DUTs 300-4a to 300-4c connected to the channels branching from the fourth channel Ch4 of the fourth tester 100-4 are to have test results independent of each other.

This will be explained as a test operation using the burn in board test device according to exemplary embodiments of the present inventive concept with reference to FIG. 5.

Figure 5:
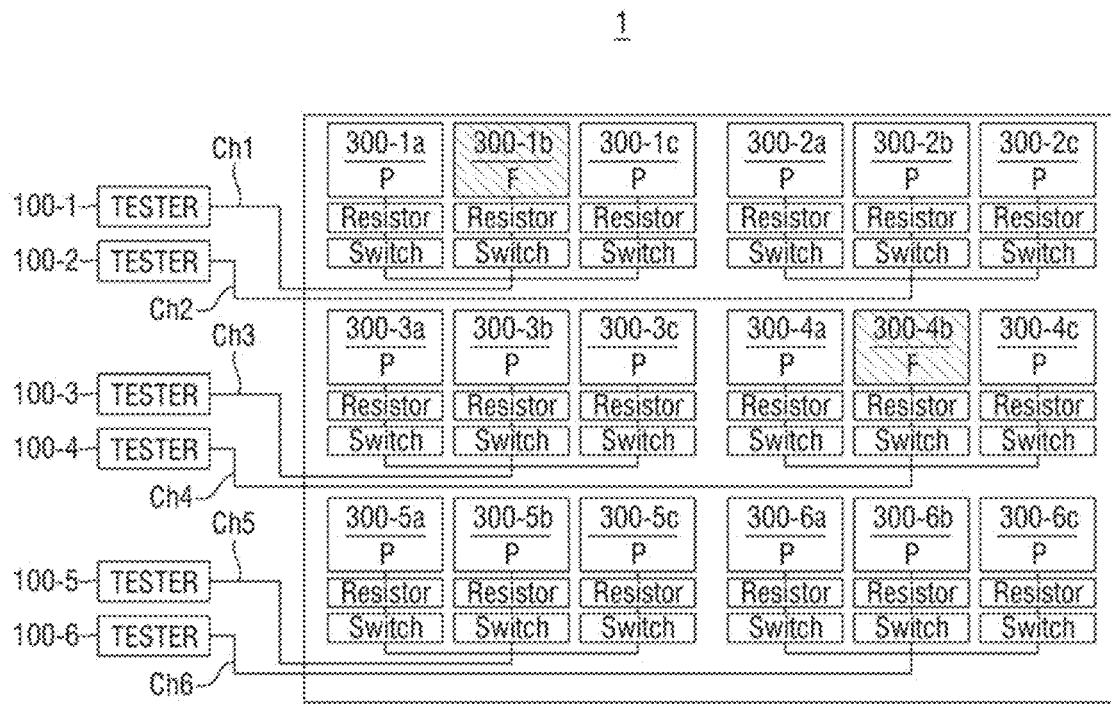
FIG. 5 is a diagram showing results of testing through the burn in board test device according to exemplary embodiments of the present inventive concept.

FIG. 5 is a diagram showing results of testing through the burn in board test device according to exemplary embodiments of the present inventive concept. For reference, repeated explanation of the aforementioned contents will not be provided.

Referring to FIG. 5, a resistor and a DUT switch are connected to each of a plurality of sub I/O channels branching from the plurality of main I/O channels Ch1 to Ch6 of the burn in board test device 1 according to exemplary embodiments of the present inventive concept.

In other words, the switch shorts the sub I/O channel to which the DUT to be tested by the testers 100-1 to 100-6 is connected, and the switch opens the sub I/O channel to which the DUT not to be tested by the testers 100-1 to 100-6 is connected. Thus, the testers 100-1 to 100-6 may independently test the DUTs to be tested.

For example, when the first tester 100-1 tests the DUT 300-1b through the sub I/O channel branching from the first main I/O channel Ch1, the switch connected to the DUT 300-1b may be closed, and the switches connected to the DUTs 300-1a and 300-1c may be opened. In addition, when the fourth tester 100-4 tests the DUT 300-4b through the sub I/O channel branching from the fourth main I/O channel Ch4, the switch connected to the DUT 300-4b may be closed, and the switches connected to the DUTs 300-4a and 300-4c may be opened.

In other words, when the first tester 100-1 tests the DUT 300-1b through the sub I/O channel branching from the first main I/O channel Ch1, the influence occurring in other DUTs 300-1a and 300-1c (for example, defects that occur in the sub I/O channels connected to other DUTs 300-1a and 300-1c) may not affect the test of the DUT 300-1b, since the switches connected to the DUTs 300-1a and 300-1c are open. In addition, when the fourth tester 100-4 tests the DUT 300-4b through the sub I/O channel branching from the fourth main I/O channel Ch4, the influence occurring in other DUTs 300-4a and 300-4c (for example, defects that occur in the sub I/O channels connected to other DUTs 300-4a and 300-4c) may not affect the test of the DUT 300-4b, since the switches connected to the DUTs 300-4a and 300-4c are open.

If the test is not performed independently through the switch like the burn in board test device 1 according to exemplary embodiments of the present inventive concept, interference may occur in the test results between a plurality of DUTs. This will be explained in detail with reference to FIG. 6.

Figure 6:
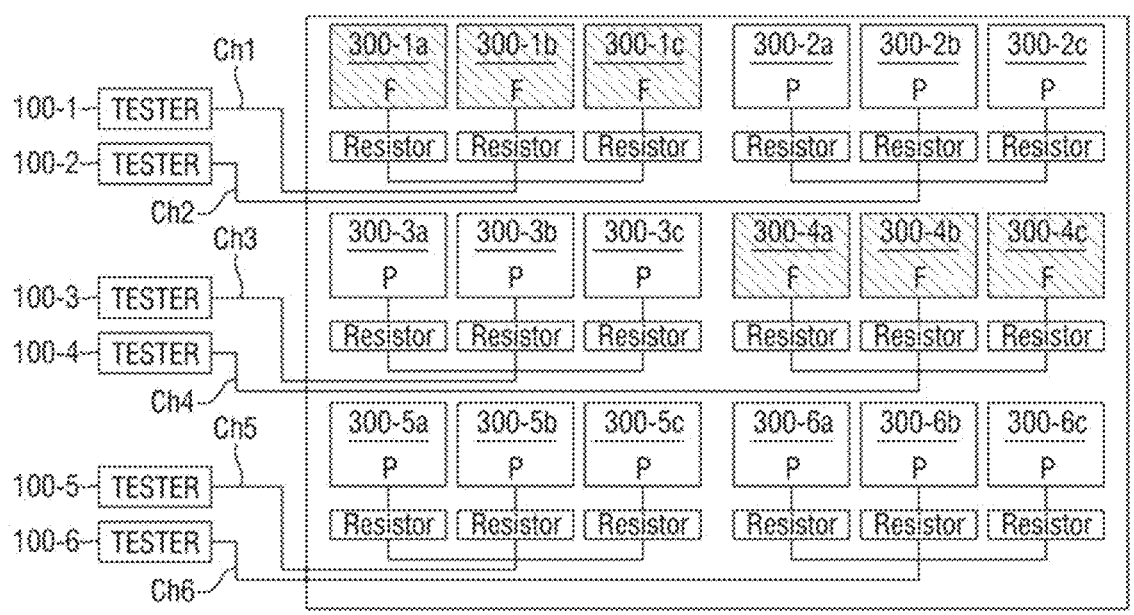
FIG. 6 is a diagram in which a failure occurs during operation of the burn in board test device.

FIG. 6 is a diagram in which a failure occurs during operation of the burn in board test device.

Referring to FIG. 6, unlike the burn in board test device 1 according to exemplary embodiments of the present inventive concept as shown in FIG. 5, in a burn in board test device 2, only a resistor is connected to each of a plurality of sub I/O channels branching from the plurality of main I/O channels Ch1 to Ch6, but the DUT switch is not connected thereto.

In other words, the DUT to be tested by the testers 100-1 to 100-6 may be affected by the element (e.g., the defect that occurs in another DUT) that occurs in another DUT.

For example, it is assumed that a defect occurs in any one of other DUTs 300-1a and 300-1c when the first tester 100-1 tests the DUT 300-1b through the sub I/O channel branching from the first main I/O channel Ch1. In this case, as shown in FIG. 5, a fail (F) is to be generated as a test result only in the DUT 300-1b in which a defect occurs. However, due to a defect occurring in any one of the other DUTs 300-1a and 300-1c, test results of all the DUTs 300-1a to 300-1c which share the channel branching from the first channel Ch1 may be fail.

In addition, for example, it is assumed that a defect occurs in any one of other DUTs 300-4a and 300-4c when the fourth tester 100-4 tests the DUT 300-4b through the sub I/O channel branching from the fourth main I/O channel Ch4. In this case, as shown in FIG. 5, a fail is to be generated as a test result only in the DUT 300-4b in which a defect occurs. However, due to a defect occurring in any one of other DUTs 300-4a and 300-4c, test results of all the DUTs 300-4a to 300-4c which share the channel branching from the first channel Ch1 may be fail.

In other words, the DUTs to be executed by the testers 100-1 to 100-6 may be affected by the element (e.g., the defect occurring in the other DUT) occurring in the other DUT.

Figure 7:
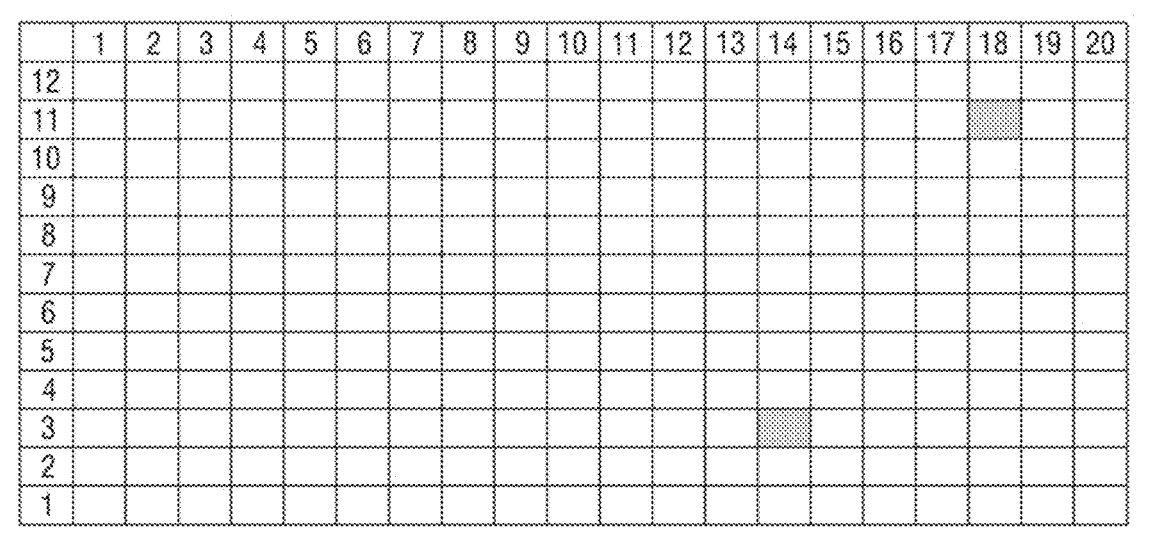

FIG. 7 is a diagram of a plurality of burn in boards in which a test result is normal.

Referring to FIG. 7, DUTs including the plurality of burn in boards are arranged in a matrix. For reference, the number and arrangement of DUTs are not limited to this drawing.

A plurality of DUTs tested through the burn in board test device according to exemplary embodiments of the present inventive concept may be tested while maintaining the respective independences.

For example, it is assumed that four DUTs are connected to the sub I/O channels branching from a single main I/O channel. For example, it is assumed that DUTs of the 11th row and 17th column, the 11th row and 18th column, the 11th row and 19th column, and the 11th row and 20th column are connected to sub I/O channels branching from a single main I/O channel. In this case, it is assumed that the test is performed only on the DUT arranged in the 11th row and the 18th column. However, it is assumed that a defect occurs in at least one of the DUTs arranged in the 11th row and 17th column, the 11th row and 19th column, and the 11th row and 20th column. However, since the burn in board test device according to exemplary embodiments of the present inventive concept operates so that only the DUT arranged in the 11th row and the 18th column is tested through the DUT switch, a defect occurring in at least one DUT among the DUTs arranged in the 11th row and 17th column, the 11th row and 19th column, and the 11th row and 20th column does not affect the test of the DUT arranged in the 11th row and 18th column. In other words, it is possible to derive an occurrence of a device failure through test of the DUT arranged in the 11th row and 18th column.

In another example, it is assumed that four DUTs are connected to sub I/O channels branching from a single main I/O channel. For example, it is assumed that the DUTs of the 3rd row and 13th column, the 3rd row and 14th column, the 3rd row and 15th column, and the 3rd row and 16th column are connected to sub I/O channels branching from a single main I/O channel. In this case, it is assumed that the test is performed only on the DUT arranged in the 3rd row and 14th column. In addition, it is assumed that a defect occurs in at least one of the DUTs arranged in the 3rd row and 13th column, the 3rd row and 14th column, and the 3rd row and 16th column. However, since the burn in board test device according to exemplary embodiments of the present inventive concept operates so that only the DUT arranged in the 3rd row and 14th column is tested through the DUT switch, a defect occurring in at least one of the DUTs arranged in the 3rd row and 13th column, the 3rd row and 14th column, and the 3rd row and 16th column does not affect the test of DUTs arranged in the 3rd row and 15th column. In other words, it is possible to derive the occurrence of a device failure through the test of the DUT arranged in the 3rd row and 15th column.

However, if independence of the tests on the plurality of DUTs is not maintained, the defects on other DUTs may affect the results of the DUT to be tested. This will be explained with reference to FIG. 8.

Figure 8:
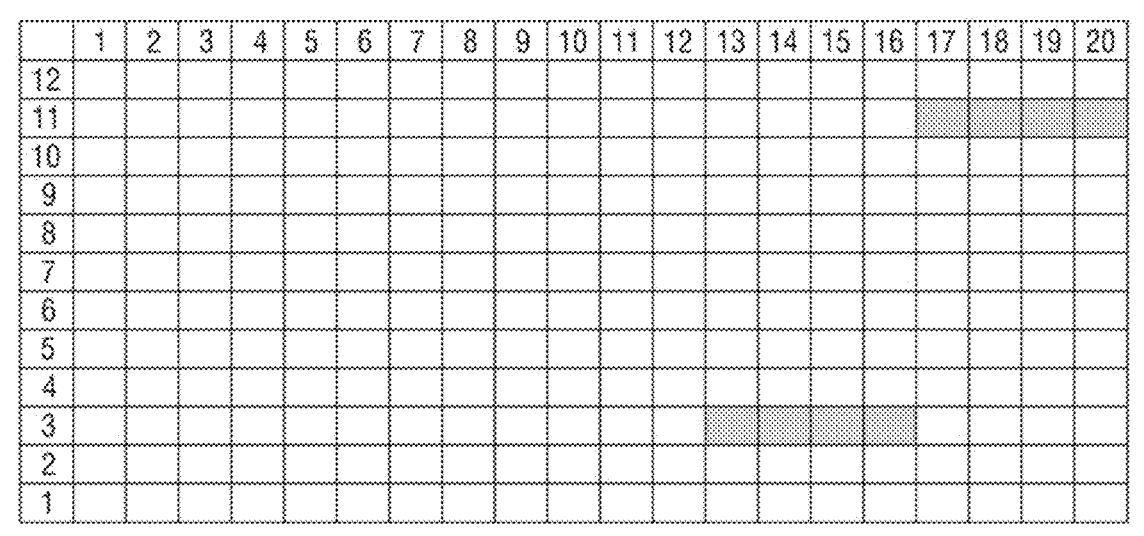

FIG. 8 is a diagram of a plurality of burn in boards in which the test results are abnormal. For reference, the repeated explanation of FIG. 7 will not be provided.

Referring to FIG. 8, DUTs including the plurality of burn in boards are arranged in a matrix. For reference, the number and arrangement of DUTs are not limited to this drawing.

There may be a case where a plurality of DUTs tested through the burn in board test device may not maintain the aforementioned independence.

For example, it is assumed that four DUTs are connected to the sub I/O channels branching from a single main I/O channel. For example, it is assumed that DUTs of the 11th row and 17th column, the 11th row and 18th column, the 11th row and 19th column, and the 11th row and 20th column are connected to sub I/O channels branching from a single main I/O channel. In this case, it is assumed that the test is performed only on the DUT arranged in the 11th row and the 18th column. Incidentally, it is assumed that a defect occurs in at least one of the DUTs arranged in the 11th row and 17th column, the 11th row and 19th column, and the 11th row and 20th column. As a result, a fail occurs as the test result of the DUT arranged in the 11th row and the 18th column, and a fail may occur in all of the 11th row and 17th column, the 11th row and 19th column, and the 11th row and 20th column.

In another example, it is assumed that four DUTs are connected to the sub I/O channels branching from a single main I/O channel. For example, it is assumed that the DUTs of the 3rd row and 13th column, the 3rd row and 14th column, the 3rd row and 15th column, and the 3rd row and 16th column are connected to sub I/O channels branching from a single main I/O channel. In this case, it is assumed that the test is performed only on the DUT arranged in the 3rd row and 14th column. In addition, it is assumed that a defect occurs in at least one of the DUTs arranged in the 3rd row and 13th column, the 3rd row and 15th column, and the 3rd row and 16th column. As a result, a fail occurs as the test result for a DUT arranged in the 3rd row and 14th column, and a fail may occur in all of the 3rd row and 13th column, the 3rd row and 15th column, and the 3rd row and 16th column.

Figure 9:
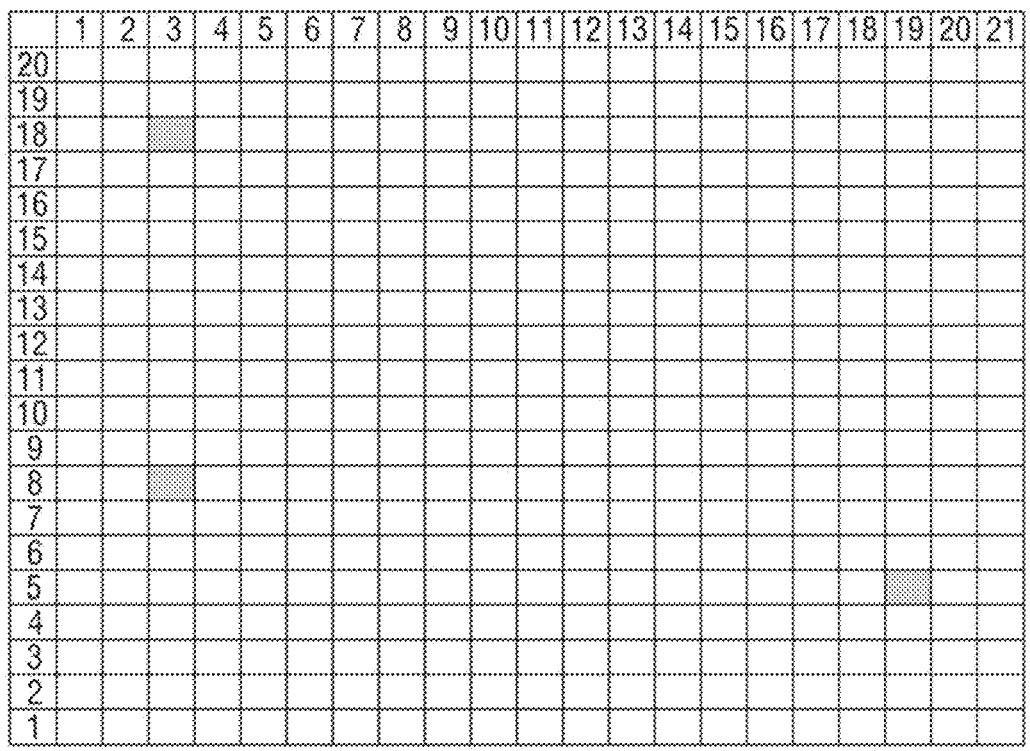
FIG. 9 is another diagram of a plurality of burn in boards in which the test results are normal.
Figure 10:
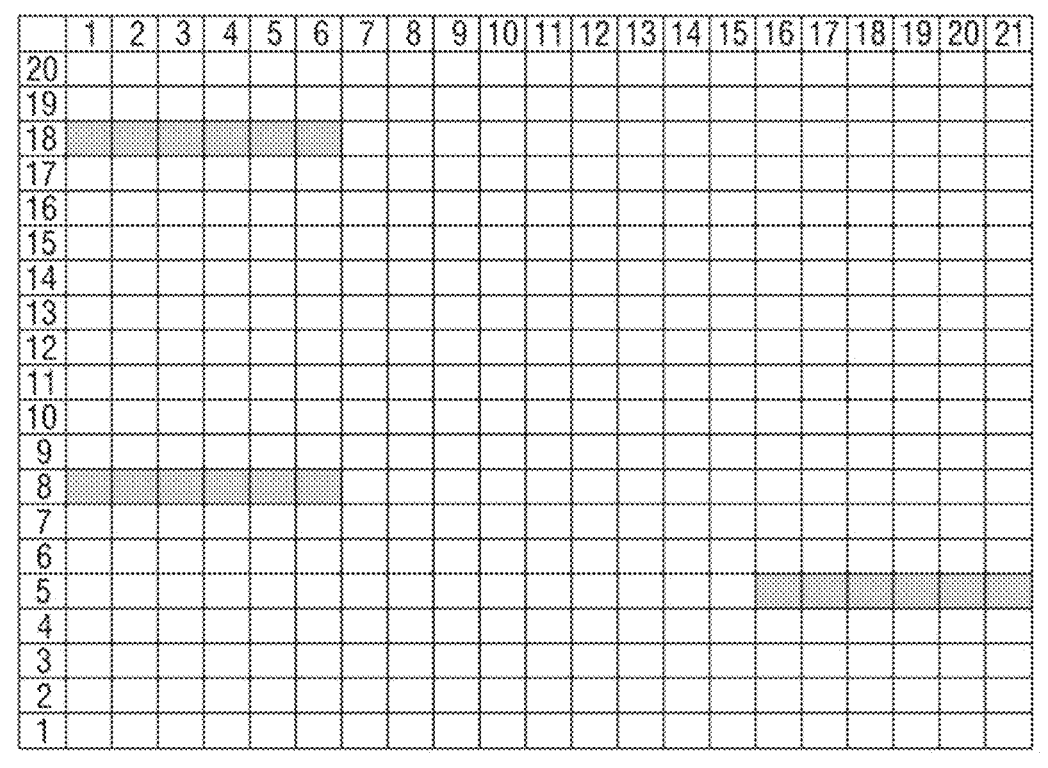

FIGS. 9 and 10 below are explanations of the inspection of an expanded number of DUTs. Repeated explanation of the aforementioned contents will not be provided.

FIG. 9 is another diagram of a plurality of burn in boards in which the test results are normal.

Referring to FIG. 9, DUTs including the plurality of burn in boards are arranged in a matrix. For reference, the number and arrangement of DUTs are not limited to this drawing.

A plurality of DUTs tested through the burn in board test device according to exemplary embodiments of the present inventive concept may be tested, while maintaining the respective independences.

For example, it is assumed that six DUTs are connected to sub I/O channels branching from a single main I/O channel. For example, it is assumed that DUTs of the 18th row and 1st column, the 18th row and 2nd column, the 18th row and 3rd column, the 18th row and 4th column, the 18th row and 5th column, and the 18th row and 6th column are connected to the sub I/O channels branching from a single main I/O channel. In this case, it is assumed that the test is performed only on the DUT arranged in the 18th row and 3rd column. In addition, it is assumed that a defect occurs in at least one of the DUTs arranged in the 18th row and 1st column, the 18th row and 2nd column, the 18th row and 4th column, the 18th row and 5th column, and the 18th row and 6th column. However, since the burn in board test device according to exemplary embodiments of the present inventive concept operates so that only the DUT arranged in the 18th row and 3rd column is tested through the DUT switch, a defect occurring in at least one DUT among the DUTs arranged in the 18th row and 1st column, the 18th row and 2nd column, the 18th row and 4th column, the 18th row and 5th column, and the 18th row and 6th column does not affect the test of DUT arranged in the 18th row and 3rd column. In other words, it is possible to derive that a fail occurs through test of the DUT arranged in the 18th row and 3rd column by leaving the other five switches connected to the aforementioned DUTs open.

In still another example, it is assumed that six DUTs are connected to sub I/O channels branching from a single main I/O channel. For example, it is assumed that DUTs of the 8th row and 1st column, the 8th row and 2nd column, the 8th row and 3rd column, the 8th row and 4th column, the 8th row and 5th column, and the 8th row and 6th column are connected to the sub I/O channels branching from a single main I/O channel. In this case, it is assumed that the test is performed only on the DUT arranged in the 8th row and 3rd column. In addition, it is assumed that a defect occurs in at least one of the DUTs arranged in the 8th row and 1st column, the 8th row and 2nd column, the 8th row and 4th column, the 8th row and 5th column, and the 8th row and 6th column. However, since the burn in board test device according to exemplary embodiments of the present inventive concept operates so that only the DUT arranged in the 8th row and 3rd column is tested through the DUT switch, a defect occurring in at least one of the DUTs arranged in the 8th row and 1st column, the 8th row and 2nd column, the 8th row and 4th column, the 8th row and 5th column, and the 8th row and 6th column does not affect the test of DUT arranged in the 8th row and 3rd column. In other words, it is possible to derive that a fail occurs through a test of the DUT arranged in the 8th row and 3rd column.

Furthermore, for example, it is assumed that six DUTs are connected to sub I/O channels branching from a single main I/O channel. For example, it is assumed that DUTs of the 5th row and 16th column, the 5th row and 17th column, the 5th row and 18th column, the 5th row and 19th column, the 5th row and 20th column, and the 5th row and 21th column are connected to the sub I/O channels branching from a single main I/O channel. In this case, it is assumed that the test is performed only on the DUT arranged in the 5th row and 19th column. In addition, it is assumed that a defect occurs in at least one of the DUTs arranged in the 5th row and 16th column, the 5th row and 17th column, the 5th row and 18th column, the 5th row and 20th column, and the 5th row and 21th column. However, since the burn in board test device according to exemplary embodiments of the present inventive concept operates so that only the DUT arranged in the 5th row and the 19th column is tested through the DUT switch, e.g., by activating only the DUT switch connected to the 5th row and the 19th column, a defect occurring in at least one of the DUTs arranged in the 5th row and 16th column, the 5th row and 17th column, the 5th row and 18th column, the 5th row and 20th column, and the 5th row and 21th column does not affect the test of the DUT arranged in the 5th row and 19th column. In other words, it is possible to derive the occurrence of the fail through the test of the DUT arranged in the 5th row and the 19th column.

However, if independences of tests on a plurality of DUTs are not maintained, the defects of other DUTs may affect the results of the DUT to be tested. This will be explained with reference to FIG. 10.

FIG. 10 is another diagram of a plurality of burn in boards in which the test result is abnormal.

Referring to FIG. 10, DUTs including the plurality of burn in boards are arranged in a matrix. For reference, the number and arrangement of DUTs are not limited to this drawing.

There may be a case where independences of the plurality of DUTs tested through the burn in board test device are mot maintained.

For example, it is assumed that six DUTs are connected to sub I/O channels branching from a single main I/O channel. For example, it is assumed that DUTs of the 18th row and 1st column, the 18th row and 2nd column, the 18th row and 3rd column, the 18th row and 4th column, the 18th row and 5th column, and the 18th row and 6th column are connected to the sub I/O channels branching from a single main I/O channel. In this case, it is assumed that the test is performed only on the DUT arranged in the 18th row and 3rd column. In addition, it is assumed that a defects occurs in at least one of the DUTs arranged in the 18th row and 1st column, the 18th row and 2nd column, the 18th row and 4th column, the 18th row and 5th column, and the 18th row and 6th column. As a result, a fail occurs as the test result of the DUT arranged in 18th row and 3rd column, and a fail may occur in all of the 18th row and 1st column, the 18th row and 2nd column, the 18th row and 4th column, the 18th row and 5th column, and the 18th row and 6th column, since their switches are closed.

As another example, it is assumed that six DUTs are connected to sub I/O channels branching from a single main I/O channel. For example, it is assumed that DUTs of the 8th row and 1st column, the 8th row and 2nd column, the 8th row and 3rd column, the 8th row and 4th column, the 8th row and 5th column, and the 8th row and 6th column are connected to the sub I/O channels branching from a single main I/O channel. In this case, it is assumed that the test is performed only on the DUT arranged in the 8th row and 3rd column. In addition, it is assumed that a defect occurs in at least one of the DUTs arranged in the 8th row and 1st column, the 8th row and 2nd column, the 8th row and 4th column, the 8th row and 5th column, and the 8th row and 6th column. As a result, a fail occurs as the test result of the DUT arranged in the 8th row and 3rd column, and a fail may occur in all of the 8th row and 1st column, the 8th row and 2nd column, the 8th row and 4th column, the 8th row and 5th column, and the 8th row and 6th column, since their switches are closed.

Furthermore, for example, it is assumed that six DUTs are connected to sub I/O channels branching from a single main I/O channel. For example, it is assumed that DUTs of the 5th row and 16th column, the 5th row and 17th column, the 5th row and 18th column, the 5th row and 19th column, the 5th row and 20th column, and the 5th row and 21th column are connected to the sub I/O channels branching from a single main I/O channel. In this case, it is assumed that the test is performed only on the DUT arranged in the 5th row and 19th column. In addition, it is assumed that a defect occurs in at least one of the DUTs arranged in the 5th row and 16th column, the 5th row and 17th column, the 5th row and 18th column, the 5th row and 20th column, and the 5th row and 21th column. As a result, a fail occurs as the test result of the DUT arranged in the 5th row and the 19th column, and a fail may occur in all of the 5th row and 16th column, the 5th row and 17th column, the 5th row and 18th column, the 5th row and 20th column, and the 5th row and 21th column.

Figure 11:
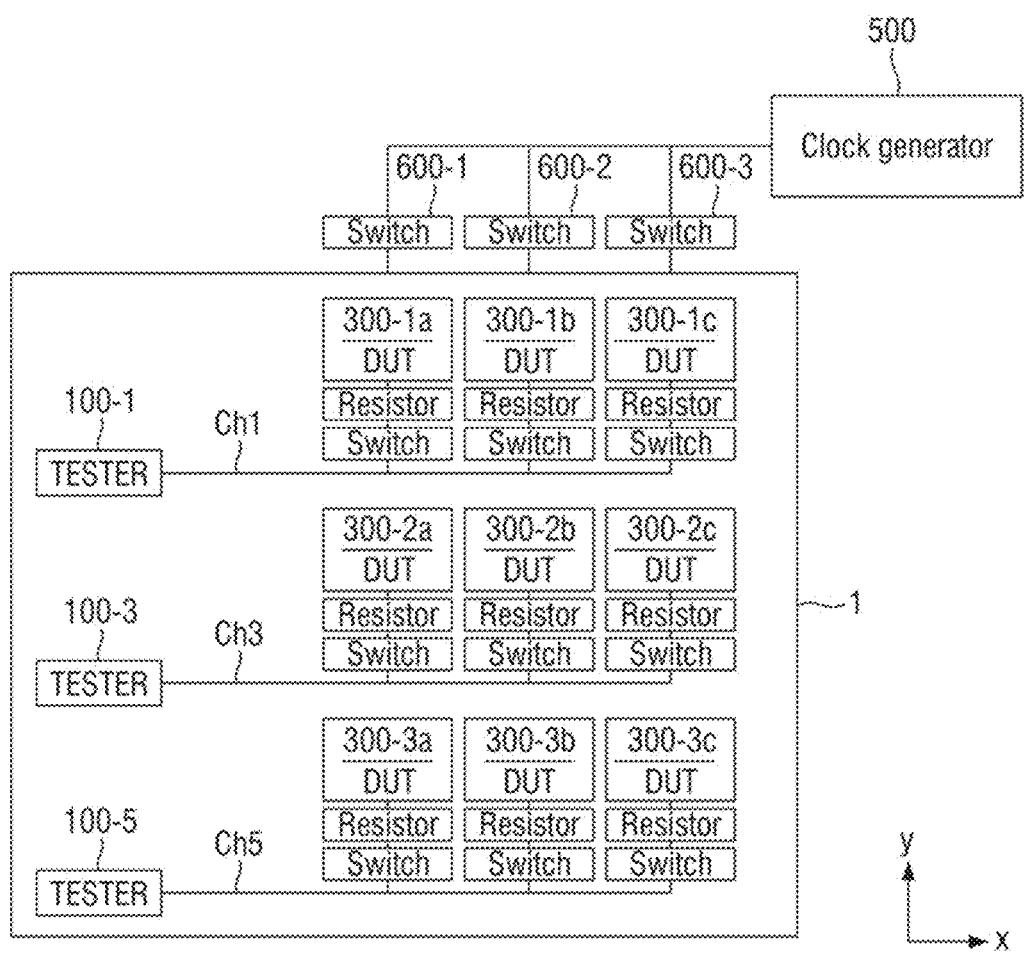
FIG. 11 is a diagram showing a burn in board test system including the burn in board test device according to exemplary embodiments of the present inventive concept.

FIG. 11 is a diagram showing a burn in board test system including the burn in board test device according to exemplary embodiments of the present inventive concept. Repeated explanation of the aforementioned contents may not be provided below.

Referring to FIG. 11, a circuit burn in board test system including the burn in board test device 1 according to exemplary embodiments of the present inventive concept includes a clock generator 500, a plurality of clock switches 600-1, 600-2 and 600-3, and the burn in board test device according to exemplary embodiments of the present inventive concept.

The plurality of DUTs 300-1a to 300-1c, 300-2a to 300-2c, and 300-3a to 300-3c of the burn in board test device 1 according to exemplary embodiments of the present inventive concept may be disposed in a first direction x, and a second direction y intersecting the first direction x.

The clock generator 500 is connected to the burn in board test device 1 according to exemplary embodiments of the present inventive concept to transfer the clocks to each of the DUTs 300-1a to 300-1c, 300-2a to 300-2c, and 300-3a to 300-3c.

For example, the clock generator 500 may generate and transfer clocks to the DUTs 300-1a, 300-2a, and 300-3a arranged side by side in the second direction y. Alternatively, the clock generator 500 may generate and transfer clocks to the DUTs 300-1b, 300-2b, and 300-3b arranged side by side in the second direction y. Alternatively, the clock generator 500 may generate and transfer clocks to the DUTs 300-1c, 300-2c, and 300-3c arranged side by side in the second direction y.

In this case, a first clock switch 600-1 may be connected to the channel to which the clock generator 500 and the DUTs 300-1a, 300-2a, and 300-3a are connected. In addition, a second clock switch 600-2 may be connected to the channel to which the clock generator 500 and the DUTs 300-1b, 300-2b, and 300-3b are connected. Further, a third clock switch 600-3 may be connected to the channel to which the clock generator 500 and the DUTs 300-1c, 300-2c, and 300-3c are connected.

In other words, when transmitting the clock generated by the clock generator 500 to the DUTs 300-1a, 300-2a, and 300-3a, the first clock switch 600-1 is closed, and the remaining clock switches 600-2 and 600-3 may be opened. In addition, when transmitting the clock generated by the clock generator 500 to the DUTs 300-1b, 300-2b, and 300-3b, the second clock switch 600-2 is closed, and the remaining clock switches 600-1 and 600-3 may be opened. In addition, when transmitting the clock generated by the clock generator 500 to the DUTs 300-1c, 300-2c, and 300-3c, the third clock switch 600-3 is closed and the remaining clock switches 600-1 and 600-2 may be opened.

The test may also be performed through a scan operation using the aforementioned clock switches 600-1, 600-2, and 600-3. In other words, when the first clock switch 600-1 is closed, the remaining clock switches 600-2 and 600-3 are opened, and the burn in test is performed on the DUTs 300-1a, 300-2a, and 300-3a. After that, the second clock switch 600-2 is closed, the remaining clock switches 600-1 and 600-3 are opened, and the burn in test is performed on the DUTs 300-1b, 300-2b, and 300-3b. Finally, the third clock switch 600-3 is closed, the remaining clock switches 600-1 and 600-2 are opened, and the burn in test is performed on the DUTs 300-1c, 300-2c, and 300-3c.

The arrangement and shape of the burn in board test system including the burn in board test device 1 according to exemplary embodiments of the present inventive concept are not limited thereto, and the arrangement shape and the number of testers or DUTs included in the burn in board test device 1 according to exemplary embodiments of the present inventive concept are not limited thereto.

Exemplary embodiments of the present inventive concept provide a burn in board test device which ensures independence of the test result at the time of the test operation for DUTs connected to each of the sub I/O channels branching from a single channel.

Exemplary embodiments of the present inventive concept also provide a burn in board test system which ensures independence of the test result at the time of the test operation for DUTs connected to each of the sub I/O channels branching from a single channel.

While the present inventive concept has been described with reference to exemplary embodiments thereof, it will be understood by those of ordinary skill in the art that various changes in form and details may be made thereto without departing from the spirit and scope of the present inventive concept as set forth by the following claims.

What is claimed is:

1. A burn in board test system, comprisina:
a clock generator which generates a clock;
a plurality of devices under test, wherein each of the devices under test includes a burn in device and including a first device under test and a second device under test;
a plurality of clock switches which transmits the clock to the plurality of devices under test and including a first clock switch directly connected to the first device under test and a second clock switch directly connected to the second device under test;
a plurality of resistors connected to each of the plurality of devices under test;
a plurality of device under test switches connected to each of the plurality of resistors; and
a device under test tester which is connected to a plurality of Rib input/output (I/O) channels connected to each of the plurality of device under test switches, and a main I/O channel for connecting the plurality of sub I/O channels to each other to test the plurality of devices under test.

2. The burn in board test system of claim 1, wherein at least one of the plurality of resistors has a resistance value of 10 ohms or more and less than 1000 ohms.

3. The burn in board test system of claim 1, wherein at least one of the plurality of device under test switches includes a transmission gate.

4. The burn in board test system of claim 1, wherein at least one of the plurality of device under test switches includes a metal-oxide-semiconductor (MOS) transistor.

5. The burn in board test system of claim 1, wherein the plurality of device under test switches operates when the tester reads data stored in the plurality of devices under test.

6. The burn in board test system of claim 5, wherein the plurality of device under test switches is turned on when the device under test tester reads data in the plurality of devices under test to short the plurality of sub I/O channels.

7. The burn in board test system of claim 5, wherein the plurality of device under test switches operates to open some of the plurality of sub I/O channels.

8. A burn in board test system, comprising:
a clock generator which generates a clock;
a Device Under Test (DUT) tester connected to a plurality of devices under test through a first channel to test the plurality of devices under test;
a plurality of clock switches which transmit the clock to the plurality of devices under test and including a first clock switch and a second clock switch;
a plurality of DUT switches connected between the plurality of devices under test and the DUT tester; and
a plurality of resistors connected between the plurality of devices under test and the DUT tester,
wherein the plurality of devices under test include a first device under test directly connected to the first clock switch and a second device under test directly connected to the second dock switch,
Wherein a first DUT switch of the plurality of DUT switches connected to the first device under test shorts a sub channel connecting the first device under test to the first channel when the first device under test is tested.

9. The burn in board test system of claim 8, wherein the first DUT switch opens the sub channel when the first device under test is not tested.

10. The burn in board test system of claim 8, wherein at least one of the resistors has a resistance value of 10 ohms or more and less than 1000 ohms.

11. The bum in board test system of claim 8, wherein at least one of the DUT switches is a transmission gate.

12. The burn in board test system of claim 8, therein at least one of the DUT switches is a netal-oxide-semiconductor (MOS) transistor.

13. A burn in board test system, comprising:
a clock generator which generates a clock;
a plurality of clock switches which transmits the clock; and
a burn in board test device which operates by the clock, wherein the burn in board test device includes
a plurality of devices under test arranged in a first direction, and a second. direction intersecting the first direction,
a plurality of device under test testers which tests the plurality of devices under test arranged side by side in the first direction, among the plurality of devices under test,
a plurality of resistors and a plurality of device under test switches disposed between the plurality of device under test testers and the plurality of devices under test.

14. The burn in board test system of claim 13, wherein only some of the plurality of clock switches are shorted, and the clock is transmitted only to a plurality of devices under test arranged side by side in the second direction among the plurality of devices under test.

15. The burn in board test system of claim 13, wherein at least one of the plurality of resistors has a resistance value of 10 ohms or more and less than 1000 ohms.

16. The burn in board test system of claim 13, wherein at least one of the plurality of device under test switches is a transmission gate.

17. The burn in board test system of claim 13, wherein at least one of the plurality of device under test switches is a metal-oxide-semiconductor (MOS) transistor.

18. The burn in board test system of claim 13, wherein the plurality of device under test switches operates when the device under test tester reads data stored in the plurality of devices under test.

19. The burn in board test system of claim 18, wherein the plurality of device under test switches is turned on when the device under test tester reads data on the plurality of devices under test.

20. The burn in board test system of claim 18, wherein the plurality of device under test switches operates to read the data of only sonic of the plurality of devices under test.

\* \* \* \* \*